United States Patent [19]

Caplan et al.

[11] Patent Number: 5,230,145
[45] Date of Patent: Jul. 27, 1993

[54] ASSEMBLY INCLUDING PATTERNED DIAMOND FILM SUBMOUNT WITH SELF-ALIGNED LASER DEVICE

[75] Inventors: David I. Caplan, Madison; Avishay Katz, Westfield, both of N.J.

[73] Assignee: AT&T Bell Laboratories, Murray Hill, N.J.

[21] Appl. No.: 914,814

[22] Filed: Jul. 15, 1992

[51] Int. Cl.$^5$ .............................................. H05K 3/30
[52] U.S. Cl. ...................................... 29/835; 29/840; 29/620; 361/400; 361/403; 228/123; 228/124
[58] Field of Search ................. 29/834, 835, 840, 620; 361/400, 403; 228/123, 124

[56] References Cited

U.S. PATENT DOCUMENTS

| | | | |
|---|---|---|---|
| 4,817,849 | 4/1989 | Yamamoto et al. | 29/834 |
| 4,925,701 | 5/1990 | Jansen et al. | 427/38 |
| 5,030,583 | 7/1991 | Beetz, Jr. | 437/39 |
| 5,064,809 | 11/1991 | Hed | 505/1 |

OTHER PUBLICATIONS

Efremow, N. N. et al., "Ion-beam-assisted Etching of Diamond," *J. Vac. Technol.* B 3 (1), Jan./Feb. 1985, pp. 416–418.

Primary Examiner—P. W. Echols
Attorney, Agent, or Firm—David I. Caplan

[57] ABSTRACT

A laser assembly including a diamond film submount is formed by anisotropically etching a localized indentation (recess) region in an originally completely planar face of the film. The region has one or pair of intersecting sidewalls preferably making the same angle between them as an angle made between a pair of sides of a laser device. After metallizing the remaining top face of the film, the bottom of the indentation region, and one or both of the sidewalls of the indentation region, the laser device is pushed into position in the recess with its above-mentioned pair of sides lying against one of the sidewalls and the metallization of the other sidewall, or lying against the metallization of both sidewalls; and the bottom of the laser device is quickly bonded by means of solder to the metallization on the bottom of the recess. Also, the metallization of the top face of the film is patterned using as a protective patterned mask a patterned electrically conducting layer having a prescribed resistivity, so that after further patterning it can serve as a resistor during normal electrical operation of the laser device.

19 Claims, 1 Drawing Sheet

ASSEMBLY INCLUDING PATTERNED DIAMOND FILM SUBMOUNT WITH SELF-ALIGNED LASER DEVICE

TECHNICAL FIELD

This invention relates to electronic devices such as laser devices and more particularly to methods of making assemblies including such devices integrated with diamond film submounts.

BACKGROUND OF THE INVENTION

A free-standing diamond film, mounted on a metallic platform, is an attractive submount on which to attach a laser device, in order to supply electrical access and thermal sinking to the device during laser operation. More particularly, the diamond film is advantageously initially grown by a chemical vapor deposition (CVD) process on either a silicon or a metal substrate, and then either the diamond is removed from the substrate or then the substrate is completely etched (dissolved), whereby only a free-standing diamond film remains. Then the top and bottom faces of the diamond film are advantageously subjected to a massive material removal ("thinning") process for a prescribed amount of time, whereby prescribed thicknesses from the top and bottom of the film are removed, in order to improve the thermal conductivity of the bottom region of the film and to improve the smoothness of the top surface of the film (for better thermal contact with the laser device). Such diamond material removal methods are taught, for example, in copending application Ser. No. 07/822,470 filed on Jan. 17, 1992, and in copending application Ser. No. 07/908,130 filed on Jul. 2, 1992.

A technological issue that arises in attaching the laser (or other electronic) device to the diamond film involves subsequently mechanically aligning the laser device with respect to its position on, followed by bonding the device to, its metallized bonding pad located on the top surface of the film—for the purpose of mechanical stability and of subsequently supplying electrical access to the laser device during testing and during normal operation. Precise aligning is desirable so that the device has a prescribed position with respect to the film, since it is also desirable that the film, and hence the device, is properly aligned with respect to a package that contains the film. In prior art such aligning has been obtained typically by determining the position of the laser device on its bonding pad by means of precise optical sighting, which is a cumbersome time-consuming method. Therefore it would be desirable to have a self-aligned method for precisely positioning the laser device with respect to the diamond submount followed by bonding the thus aligned device to the submount—that is to say, a precise-alignment-followed-by-bonding method that does not require precise optical sighting.

SUMMARY OF THE INVENTION

This invention provides a method of patterned anisotropic etching of an indentation region in an electrically insulating (advantageously also thermally conducting) body, such as a CVD diamond film submount, for the purpose of subsequently mechanically self-aligning and bonding an electronic device, such as a laser device, in the indentation region. The invention also provides, if so desired, that the material of a patterned protective mask used against the etching have a prescribed electrical resistivity, so that a portion of this mask can be allowed to remain intact in the final assembly and serve as a desired resistor or conductor during electrical operation of the electronic device.

More specifically, this invention provides a method of making an assembly including an electronic device comprising the steps of (a) forming a patterned protective layer on a top face of an electrically insulating film, the patterned layer having at least one boundary segment, whereby a localized area of the film is exposed in accordance with the complement of the patterned protective layer;

(b) anisotropically vertically etching the film at the exposed area to a prescribed depth that is less than total thickness of the film, using the patterned layer as a protective mask against the etching, whereby an intact portion of the top face of the film remains unetched, and whereby an indentation region is formed in the film in accordance with the complement of the patterned protective layer, the indentation region having at least a first sidewall segment and having an essentially horizontal surface located at the prescribed depth beneath the top face of the film;

(c) forming a patterned metallic layer having first, second, and third portions, the first portion being located on at least a portion of the horizontal surface of the indentation region, the second portion being located on at least a portion of the intact portion of the face of the film, and the third portion being located on at least a portion of the first or of a second sidewall segment of the indentation region, the third portion being contiguous with both the first and second portions;

(d) pushing an electronic device, having a bottom surface and at least a first vertical side, into a position in the indentation region such that its bottom surface is contiguous with at least part of the first portion of the metallic layer, and such that the first vertical side is contiguous either with at least part of the first sidewall segment of the indentation region, or with at least part of the third portion of the metallic layer; and (e) bonding the bottom surface of the electronic device to the first portion of the metallic layer.

In this way, self-aligned positioning of the device along at least one spatial direction is achieved—i.e., positioning without the need of precise optical sighting.

The "essentially horizontal" surface of the indentation region need not be perfectly smooth, but need only to supply a good base for the patterned metallic layer. Likewise, the sidewall segment(s) need not be perfectly smooth, but need only to supply a good base for alignment of the device.

It is further advantageous that the patterned protective layer has a second boundary segment making a prescribed angle with the first, whereby during step (b) the first and second sidewall segments are formed with the prescribed angle between them; and that the electronic device has at least two intersecting vertical sides making the prescribed angle between them, and that during step (d) the electronic device is pushed into the position in the indentation region such that second vertical side is contiguous either with at least part of the third portion of the metallic layer or with at least part of the second sidewall segment of the indentation region.

In this way, self-aligned positioning of the electronic device can be achieved in two directions.

It is also advantageous that the patterned protective layer is electrically conductive and subsequent to step (b) is further patterned to form a patterned resistor or patterned conductor contiguous with the first or second portions of the metallic layer.

It is also advantageous that the method further comprises subsequent to step (b) the step of further patterning the patterned protective layer to form a patterned resistor layer that has a prescribed electrical resistance that is more than that of the patterned metallic layer, and in which the patterned resistor layer has a pair of opposed edges.

It is also advantageous that the patterned resistor conductive layer has a prescribed electrical resistance that is everywhere greater than that of the patterned metallic layer. In this way, the second patterned layer can provide a desired resistor during electrical operation of the device.

It is also advantageous that the patterned protective layer comprises tantalum—for example, tantalum nitride or tantalum silicide. It is also advantageous that the electronic device is a laser device. It is also advantageous that the film is essentially a diamond film. It is also advantageous to form a metallic coating on a bottom face thereof opposing its top face. It is also further advantageous that this diamond film is essentially a chemically vapor deposited (CVD) diamond film.

It is also advantageous that the method include one or more of the following further steps: (1) the step of electrically connecting the metallic coating to a terminal of the device located on a top surface thereof opposed to its bottom surface, (2) the step of electrically connecting the metallic coating to an electrically conducting platform, and (3) the step of electrically connecting an electrical power source between the platform and a localized portion of the patterned metallic layer, advantageously contiguous with one of the edges of the patterned resistor layer.

Only for the sake of clarity none of the drawings is to scale.

DETAILED DESCRIPTION

Figure 1:
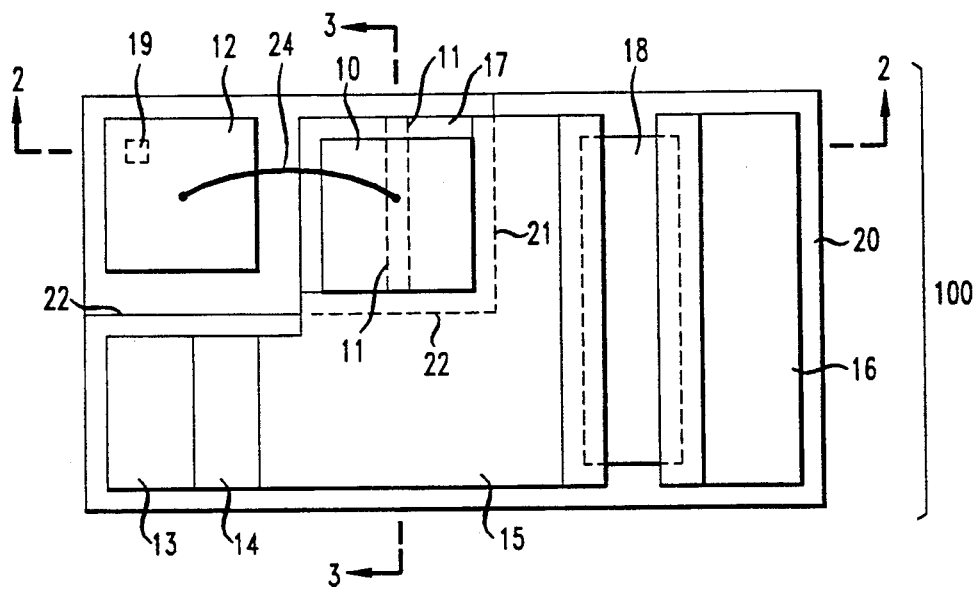
FIG. 1 is a top view diagram of a laser assembly formed in accordance with a specific embodiment of the invention.
Figure 2:
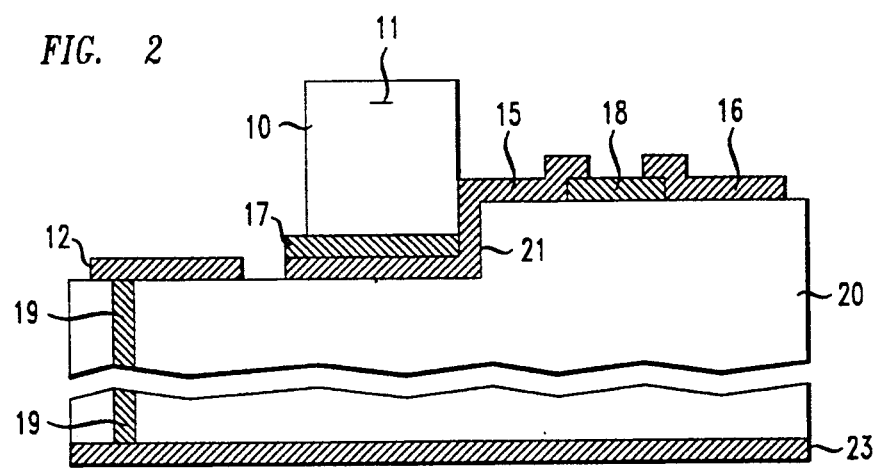
FIGS. 2 and 3 are cross sections of the assembly shown in FIG. 1.
Figure 3:
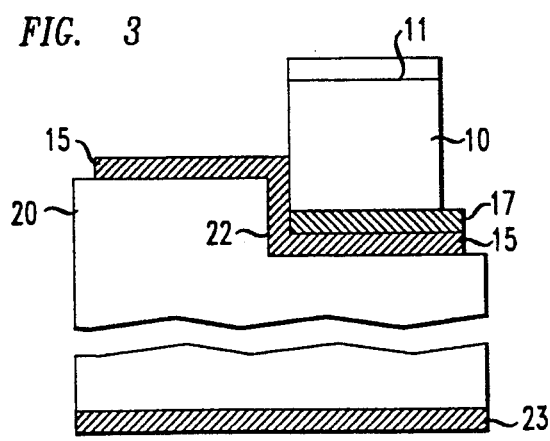

Referring now to FIGS. 1, 2, and 3, a laser assembly 100 includes a CVD diamond film 20 and a laser device 10. The device 10 has an active region 11 that can emit optical radiation in the plane of FIG. 1 when sufficient forward bias is applied, as known in the art. A localized metallic pad 12 is located on the bottom surface of an indentation region that has been anisotropically etched into the top face of the film 20 and that has vertical sidewalls (sidewall segments) 21 and 22. As indicated in FIG. 1, these sidewalls 21 and 22 intersect at an angle of approximately $\pi/2$ radian.

The laser device 10 has a pair of vertical sides intersecting at an angle whose apex is located adjacent to the intersection of the sidewalls 21 and 22. This angle advantageously is also at least approximately equal to $\pi/2$ radian. Other angles can be used, so long as in any assembly the angle between the vertical sides of the laser device 10 is at least approximately equal to the angle made by the intersection of the sidewalls 21 and 22.

On the top face of the film 20 are located a Ti/Pt/Au localized patterned contact layer 13, a Ti/Pt electrically conducting localized solder dam 14 connecting this contact layer 13 to another Ti/Pt/Au localized patterned contact layer 15, yet another Ti/Pt/Au localized patterned contact layer 16, and a localized patterned tantalum nitride resistor layer 18. An Au/Sn solder layer 17 is located between the bottom of the laser device 10 and the top surface of the contact layer 15. A portion of the patterned contact layer 15 extends to a portion of the bottom surface of the indentation region via one or (not shown) both of the sidewalls 21 and 22. It should be understood that during the application of heat for the purpose of using the solder layer 17 to bond the laser device 10 to the contact layer 15, some of the solder may migrate (not shown) to the solder dam 14 and the resistor layer 18. It should also be understood that the bottom surface of the laser device 10 typically is metallized with a Ti/Pt/Au contact layer (not shown).

The aforementioned sides of the laser device 10 are respectively located (not shown) contiguous with the portion of the patterned contact layer 15 located on one of the sidewalls 21 or 22 and with the other sidewall 22 or 21 of the indentation region, or are located (as shown) contiguous with portions of the patterned contact layer 15 located on both sidewalls 21 and 22 of the indentation region.

The bottom face of the diamond film is metallized with a metallic coating 23 such as Ti/Pt/Au. This metallic coating 23 is bonded to a metallic platform (not shown).

The diamond film 20 has a via hole, extending between its top and bottom faces, that is filled with an electrically conducting layer or plug 19 for the purpose of electrically connecting the contact layer 12 to the metallic coating 23 and hence to the metallic platform. Alternatively, the wall of the via hole is graphitized in order to render it electrically conductive, as described in copending application Ser. No. 07/870,841 filed on Apr. 17, 1992, or the wall of the via hole is graphitized and the thus graphitized hole is coated or filled with an electrically conducting plug.

A metallic wire bond 24 connects an ohmic contact layer (not shown), located on the top surface of the laser device 10, with the contact layer 12, in order to furnish electrical connection between them. During electrical operations, all metallic components shown in the assembly 100 contribute negligible resistance as compared with that of the resistor layer 18.

For normal electrical operation, a power source (not shown), including a dc source connected in series with an ac (RF) source, is connected between the contact layer 16 and the platform (not shown). The polarity of the dc source is arranged so as to forward bias the laser device 10. Thereby the following electrical path is established: platform, the metallic coating 23, the plug 19, the contact layer 12, the wire bond 24, from top to bottom contact layers of the laser device 10, the solder layer 17, the contact layer 15, the resistor layer 18, the contact layer 16, and the power source.

For a testing operation, a power source (not shown) is connected between the contact layers 12 and 13. The electrical path is as follows: contact layer 12, the wire bond 24, from top to bottom contacts of the laser device 10, the solder layer 17, the contact layer 15, the solder dam 14, the contact layer 13, and the power source. In this way, the resistor layer 18 is bypassed, but if desired a resistor can be incorporated in series with the power source. More important, the laser device 10 can thus be tested without the expense of bonding the diamond film 20 to the platform.

It should be understood that many assemblies similar to the assembly 100 can be simultaneously formed, insofar as anisotropic etching and patterned metallization are concerned, using a relatively large-area diamond film followed by laser-dicing the film into many relatively small-area films each of which is in accordance with the film 20 and its metallizations.

In order to form the assembly 100, the following procedure is advantageous. A CVD diamond film having an initially flat top face (not shown) is prepared, as by growth on a silicon body, as more fully described in the aforementioned copending patent application Ser. No. 07/822470 filed on Jan. 17, 1992, or in the aforementioned copending patent application Ser. No. 07/908130 filed on Jul. 2, 1992. This top face is everywhere coated with a uniformly thick electrically conductive protective layer of tantalum nitride—or of another suitable electrically conductive material that has a desired resistivity and that can be patterned and used as a protective mask against subsequent anisotropic etching of the diamond film, such as tantalum silicide. This conductive layer is then patterned by standard photolithographic spatially selective masking and wet or dry etching, whereby it becomes a patterned conductive layer extending to the sidewalls 21 and 22 that are subsequently to be etched into the diamond film (the patterned conductive layer being absent from areas overlying the indentation region to be etched). Using this patterned conductive layer as a protective mask against etching, the indentation region is anisotropically etched into the diamond film to a depth in the approximate range of 3 to 6 $\mu$m. Useful approximate values of parameters for this anisotropic etching of the diamond film are as follows: 40 s.c.c.m. oxygen, 0.1 Pascal, 400 W microwave power at 2.45 GHz, and $-80$ v to $-150$ v dc bias.

Then the patterned conductive (tantalum nitride) layer can be patterned, by standard photolithographic spatially selective masking and etching, so that its topological profile becomes that of the resistor layer 18. Next a via hole is drilled from the bottom surface of the indentation region to the bottom surface of the diamond film, as by laser drilling. In this way, the wall of the via hole is graphitized and thus rendered electrically conductive. For higher electrical conductivity (i.e., negligible electrical resistance) this via hole is coated or filled by means of low pressure CVD or electroplating with a metal(s) such as W, Ti, Pt, or Au, or a suitable combination of them, in order to form the plug 19. The bottom face of the diamond film 20 is then metallized with the metallic coating 23.

The entire top surface of the diamond film 20, including the bottom surface of the indentation region and its sidewalls 21 and 22, is then coated with a Ti/Pt/Au metallic layer typically to a total thickness of approximately 0.5 $\mu$m. By standard photolithographic spatially selective masking and etching, the Au layer of this Ti/Pt/Au metallic layer is completely removed from the following areas: everywhere overlying the solder dam 14, an approximately 1 $\mu$m wide margin along the four outside edges of the film 20 (to enable the above-mentioned dicing); an approximately 1 $\mu$m wide gap between the sidewall 22 and the proximate edges of the localized contact layers 12, 13, and 15 as well as of the solder dam 14; an approximately 1 $\mu$m gap between proximate edges of the localized contact layers 12 and 15 (FIG. 2); and a gap across the resistor layer 18 sufficient to provide the desired electrical resistance between the localized contact layers 15 and 16 when the areas of the Pt and Ti layers underlying this gap are subsequently removed. Then the Pt and Ti layers of the original Ti/Pt/Au layer are completely removed from the same areas as was the Au layer except overlying the solder dam 14.

Next, the solder layer 17 is deposited to a total thickness in the approximate range of 2 $\mu$m to 4 $\mu$m. This solder layer 17 advantageously comprises a total of at least three alternating layers of gold and tin—as described, for example, in copending patent application Ser. No. 07/792,559 filed on Nov. 15, 1991. Then the laser device 10 with its bottom and top surfaces metallized (not shown) is pushed into place against the sidewalls of the contact layer 15, stemming from the sidewalls 21 and 22, while the solder is melted by heating it to a temperature of approximately 320° C. for approximately 10 seconds. After cooling, the wire bond 24 is connected, as by thermal compression bonding, between the contact layer located on the top surface of the laser device 100 and the localized contact layer 12. Then the assembly 100 is ready for testing and normal operations, depending on external power connections, as described above. For normal operation, the metallic coating 23 is bonded to the metallic platform.

Although the invention has been described in detail in terms of a specific embodiment, various modifications can be made without departing from the scope of the invention. For example, the electronic device 10 can be a semiconductor integrated circuit device. Moreover, the bottom surface of the electronic device 10 can incorporate the solder layer 17 prior to the pushing of the device into position in the indentation region, so that the solder layer 17 is initially an integral part of the device 10. Also, the device 10 can be self-aligned with (i.e., pushed against) only one of the sidewalls 21 and 22 and that one sidewall need not (ever) be metallized while the other is. Moreover, only a single (linear) sidewall segment need be etched into the film 20, and the device 10 is then self-aligned with that single sidewall segment after that single sidewall segment has been metallized (as well as has been the horizontal surface of the indentation region and the intact portion of the top face of the film.) Furthermore, the protective layer need not be allowed to remain intact as the resistor layer 18, but it can be completely removed in case it is not needed during operation as a resistor or as a conductor. Finally, a portion of the protective layer can be allowed to remain intact in the indentation region instead of, or in addition to, the intact portion of the top face of the film 20.

We claims:
1. A method comprising the steps of
   (a) forming a patterned protective layer on a top face of an electrically insulating film, the patterned layer having at least one boundary segment, whereby a localized area of the film is exposed in accordance with the complement of the patterned protective layer;
   (b) anisotropically vertically etching the film at the exposed area to a prescribed depth that is less than total thickness of the film, using the patterned layer as a protective mask against the etching, whereby an intact portion of the top face of the film remains unetched, and whereby an indentation region is formed in the film in accordance with the complement of the patterned protective layer, the indentation region having at least a first sidewall segment and having an essentially horizontal surface located at the prescribed depth beneath the top face of the film;

(c) forming a patterned metallic layer having first, second, and third portions, the first portion being located on at least a portion of the horizontal surface of the indentation region, the second portion being located on at least a portion of the intact portion of the face of the film, and the third portion being located on at least a portion of the first or of a second sidewall segment of the indentation region, the third portion being contiguous with both the first and second portions;

(d) pushing an electronic device, having a bottom surface and at least a first vertical side into a position in the indentation region such that its bottom surface is contiguous with at least part of the first portion of the metallic layer, and such that the first vertical side is contiguous either with at least part of the first sidewall segment of the indentation region or with at least part of the third portion of the metallic layer; and (e) bonding the bottom surface of the electronic device to the first portion of the metallic layer.

2. The method of claim 1 in which the patterned protective layer has a second boundary segment making a prescribed angle with the first, whereby during step (b) first and second sidewall segments are formed with the prescribed angle between them, and in which the electronic device has at least two intersecting vertical sides making the prescribed angle between them, and in which during step (d) the electronic device is pushed into the position in the indentation region such that second vertical side is contiguous either with at least part of the third portion of the metallic layer or with at least part of the second sidewall segment of the indentation region.

3. The method of claim 2 in which the patterned protective layer is electrically conductive and subsequent to step (b) is further patterned to form a patterned resistor or a patterned conductor contiguous with the first or second portions of the metallic layer.

4. The method of claim 3 in which the protective layer comprises tantalum.

5. The method of claim 2 in which the protective layer comprises tantalum.

6. The method of claim 1 in which the protective layer comprises tantalum.

7. The method of claim 1 in which the device is a laser device.

8. The method of claim 7 in which the film is essentially a diamond film and which further comprises the step of forming a metallic coating on a bottom face thereof.

9. The method of claim 8 further comprising subsequent to step (b) the step of further patterning the patterned protective layer to form a patterned resistor layer that has a prescribed electrical resistance that is more than that of the patterned metallic layer, and in which the patterned resistor layer has a pair of opposed edges.

10. The method of claim 9 in which the patterned resistor layer comprises tantalum.

11. The method of claim 10 further including the step of electrically connecting the metallic coating to a terminal of the device located on a top surface thereof.

12. The method of claim 11 further including the step of electrically connecting the metallic coating to an electrically conducting platform.

13. The method of claim 12 further including the step of electrically connecting an electrical power source between the platform and a localized portion of the patterned metallic layer contiguous with one of the edges of the second patterned conductive layer.

14. The method of claim 9 further including the step of electrically connecting the metallic coating to a terminal of the device located on a top surface thereof.

15. The method of claim 14 further including the step of electrically connecting the metallic coating to an electrically conducting platform.

16. The method of claim 15 further including the step of electrically connecting an electrical power source between the platform and a localized portion of the patterned metallic layer contiguous with one of the edges of the patterned resistor layer.

17. The method of claim 1 further comprising subsequent to step (b) the step of further patterning the patterned protective layer to form a patterned resistor layer that has a prescribed electrical resistance that is more than that of the patterned metallic layer, and in which the patterned resistor layer has a pair of opposed edges.

18. The method of claim 17 further including the step of forming a metallic coating on the bottom face of the film and the step of electrically connecting the metallic coating to an electrically conducting platform.

19. The method of claim 18 further including the step of electrically connecting an electrical power source between the platform and a localized portion of the patterned metallic layer.

* * * * *